May 27, 1969 L. H. HOKE, JR 3,447,092

TRANSISTOR AMPLIFYING CIRCUIT HAVING HIGH INPUT IMPEDANCE AND TEMPERATURE-STABILIZED OUTPUT POTENTIAL

Filed Nov. 9, 1966

INVENTOR.
LEANDER H. HOKE, JR.

D. P. Pressman

ATTORNEY 3,447,092

TRANSISTOR AMPLIFYING CIRCUIT HAVING HIGH INPUT IMPEDANCE AND TEMPERATURE-STABILIZED OUTPUT POTENTIAL

Leander H. Hoke, Jr., Southampton, Pa., assignor to Philco-Ford Corporation, Philadelphia, Pa., a corporation of Delaware Filed Nov. 9, 1966, Ser. No. 593,047
Int. Cl. H03f 3/04
U.S. Cl. 330—24 6 Claims

ABSTRACT OF THE DISCLOSURE

Amplifying circuit having high input impedance and temperature-stabilized output potential using transistor amplifying stage with emitter resistor and positive feedback circuit connected between emitter and base. Feedback circuit includes second transistor having emitter connected to emitter of first transistor and conventionally-biased collector having equal-valued resistors connected to bases of first and second transistors, respectively.

Figures 1, 2:
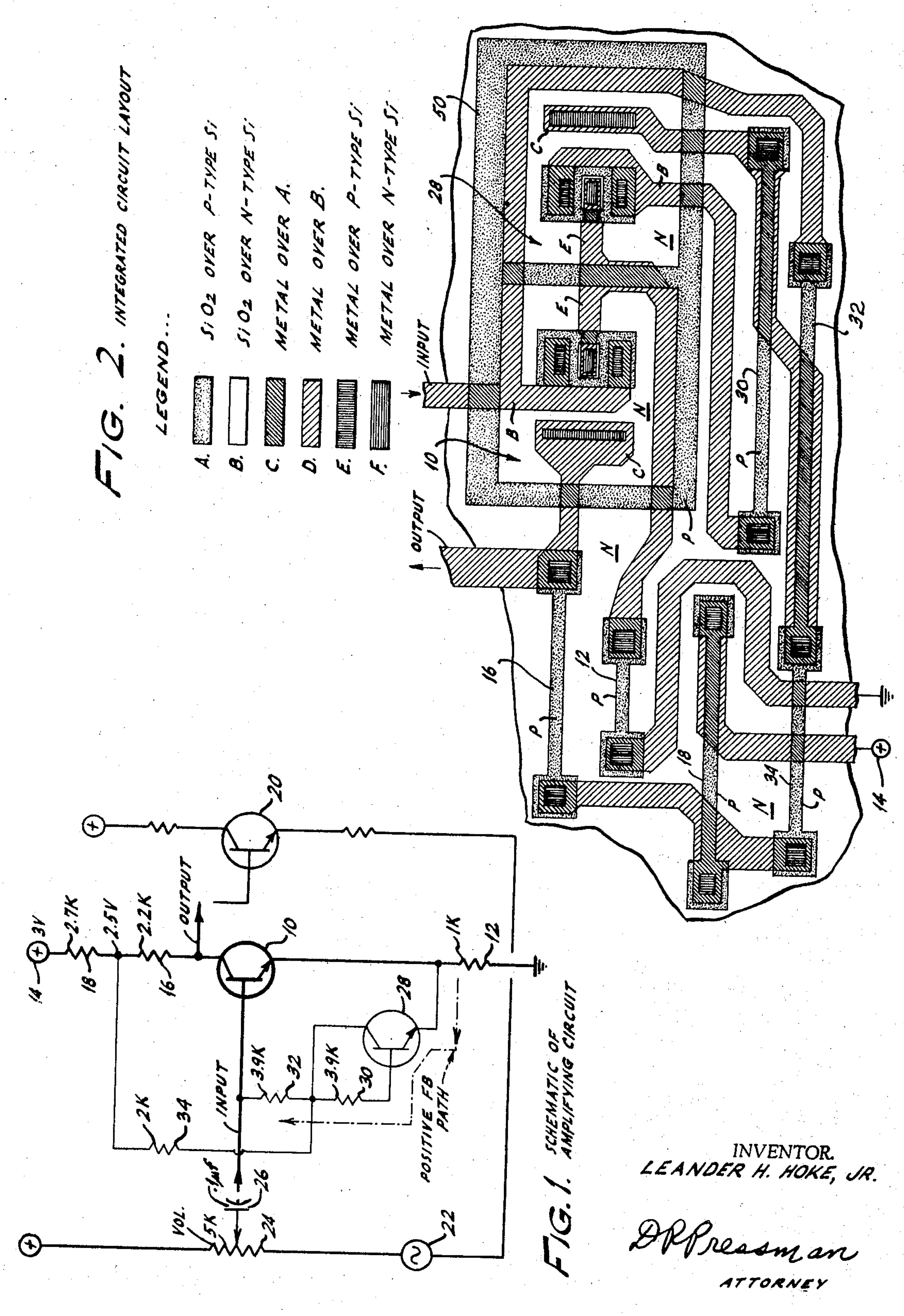

The present invention relates generally to amplifiers and particularly to an amplifying circuit which is suitable for use in integrated circuits.

In the present state of the monolithic integrated circuit art, many transistors, diodes, resistors, and sometimes capacitors can be formed within a monocrystalline chip of silicon which is smaller than a sixteenth of an inch on a side. Although such integrated circuits have heretofore been used principally in digital applications, linear and analog applications therefor are now becoming popular. A typical linear application is the audio amplifier of a radio receiver. The present invention is directed to an amplifying circuit which may be used as the first stage of an integrated circuit audio amplifier, although it is by no means limited to this application.

In a receiver formed of integrated circuits the first audio amplifying stage has several requirements associated therewith. The input impedance of this stage must be high so that the size of the capacitor which couples the output of the volume control potentiometer to the input of this stage can be reduced, thereby to reduce the overall size and weight of the radio, as is essential in order to realize fully the advantages of small size and weight of monolithic integrated circuits. In addition the direct-current output potential of the first audio amplifying stage must remain invariant as a function of temperature in order to maintain the proper bias on the input of the second audio amplifying stage inasmuch as it is desirable to direct current couple the output of the first audio stage to the input of the second audio amplifying stage.

With particular regard to the problem of providing a high input impedance, it is known that positive signal feedback from the output to the input of a stage will raise the input impedance thereof. The easiest way to provide such positive signal feedback is to connect a capacitor between a noninverted output and the input of a stage. However this is not feasible in integrated circuit technology since it is impractical to incorporate a capacitor of sufficient size in an integrated circuit, and an external capacitor of sufficient size will usually occupy many times the space and have many times the weight of the integrated circuit. With regard to the problem of maintaining the D.C. output potential of a stage invariant as a function of temperature, many solutions have been proposed, but these involve either complicated circuitry or require special compensating components, such as varistors, which cannot be incorporated in integrated circuits.

Accordingly it is one object of the present invention to provide a high input impedance audio amplifier without utilizing a feedback capacitor. Another object of the present invention is to provide an audio amplifying stage in which the direct current output potential is maintained invariant as a function of temperature with simple circuitry which can be incorporated in an integrated circuit.

A further object is to achieve the foregoing objects jointly by providing a temperature compensating and input impedance raising circuit for an amplifying stage. Additional objects and advantages will be apparent from a consideration of the ensuing description of the present invention.

SUMMARY

According to the present invention a transistorized audio amplifying stage is provided with an emitter resistor and means for supplying positive signal feedback voltage from across said emitter resistor to the base of the transistor. Said means includes a second transistor which is biased to provide a high impedance to direct currents and a low impedance to alternating currents. The collector of the second transistor is biased conventionally and a pair of substantially equal-valued resistors are connected from said collector to the base of the first and second transistors, respectively in order to provide signal feedback to the first transistor to raise the stage's input impedance and temperature compensation to maintain the D.C. output potential of the stage constant.

DRAWINGS

FIG. 1 shows a schematic of an amplifying circuit according to the invention, and FIG. 2 shows an integrated circuit layout for the circuit of FIG. 1.

FIG. 1—DESCRIPTION

In the schematic of FIG. 1, parts shown in heavy solid lines at center of the figures form the basic amplifying circuit of the invention; parts shown in light solid lines form the feedback and temperature-compensating portion of said circuit; and parts shown in solid lines seperate from the basic amplifying circuit typical input and output circuits which may be used in association with said circuit. Suitable component values are indicated in the drawing.

The amplifying stage comprises an NPN transistor 10 whose emitter is connected to ground by way of resistor 12 and whose collector is connected to a positive source 14 by way of resistors 16 and 18. An output voltage is taken at the collector terminal of transistor 10, although the output voltage could also be taken at the emitter thereof. A typical output load is represented by a succeeding amplifying stage including NPN transistor 20, whose base is directly coupled to the collector of transistor 10.

An input signal is supplied to transistor 10 from a source 22 which may represent the detector circuit of a receiver or a proceeding amplifying stage. A potentiometer 24 is provided to control the amount of signal supplied from source 22 to transistor 10. Since potentiometer 24 is connected to a DC bias source, it is necessary, in order to prevent adjustment of potentiometer 24 from changing the base bias of transistor 10, to provide a coupling capacitor 26 to couple the wiper terminal of potentiometer 24 to the base of transistor 10.

Positive signal feedback is supplied from the emitter of transistor 10 to the base thereof via a feedback circuit including transistor 28 and a pair of substantially identically-valued resistors 30 and 32. The emitter of transistor 28 is connected to the emitter of transistor 10 and the collector of transistor 28 is connected to the bases of transistor 28 and 10 by way of respective resistors 30 and 32. The collector of transistor 28 is also connected to positive source 14 by way of resistors 34 and 18. Resistor 18 thus is commonly connected to the respective collector load resistors 16 and 34. Resistor 18 acts as a voltage dropping resistance and also helps to stabilize collector currents. Source 14 could alternatively be connected directly to resistors 16 and 34 if a higher bias can be tolerated at the base of transistor 20.

FIG. 1—OPERATION OF CIRCUIT

The input signal supplied from source 22 by way of potentiometer 24 and coupling capacitor 26 is supplied across the base-emitter circuit of transistor 10 where it is amplified in conventional fashion and supplied to the base of transistor 20.

According to the invention positive signal feedback of about 0.9 times the amplitude of the input signal is coupled from the emitter to the base of transistor 10 via the base-emitter diode of transistor 28 and resistors 30 and 32. Since the base-emitter junction of transistor 28 is slightly forward biased by way of resistors 34 and 30 from source 18, the AC signal voltage supplied to the emitter of transistor 28 from across resistor 12 will vary the diode characteristic about a relatively steep portion of its operating curve, thereby to provide a relatively large change in current for a relatively small voltage change and hence present a relatively low impedance to said AC signal. The feedback circuit will present a relatively high impedance to the DC voltage across resistor 12 since the base-emitter diode of transistor 28 is only slightly forward-biased and therefore will draw a relatively small current for a relatively large voltage thereacross. This provides good bias isolation between the emitter and base of transistor 10.

In addition to providing positive signal feedback, the circuit including transistor 28 stabilizes the collector current (and hence the DC output voltage) of transistor 10 against temperature changes in the following manner: As is well known, the beta of a transistor and hence the collector current thereof will increase as a function of ambient temperature. Since transistors 10 and 28 will be closely positioned physically and part of the same body of silicon in a monolithic integrated circuit, both transistors will be subject to identical ambient temperatures so that the collector currents of both transistors will change in the same manner as a function of temperature. Assume, for example, that ambient temperature rises, thereby tending to cause the collector currents of transistors 10 and 28 to increase. The collector current increase of transistor 28 will create a greater voltage drop across resistor 34, thereby lowering the collector potential of transistor 28. This lowered collector potential will be coupled to the bases of transistors 10 and 28 via resistors 32 and 30 respectively, thereby reducing the forward bias of these transistors so as to reduce both collector currents and offset the temperature change. Similarly, if the ambient temperature decreases, the collector current decrease of transistor 28 will increase the forward bias on transistors 10 and 28, thereby increasing both collector currents to offset the effect of tempearture.

According to the invention, resistors 30 and 32 must have substantially equal values so as to insure that the bias compensation supplied to transistors 10 and 28 will be balanced. In the event one resistor, say resistor 30, were made smaller than the other, more current would tend to flow through resistor 30 and hence through the base-emitter circuit of transistor 28 than through resistors 32 and the base-emitter circuit of transistor 10 so that part of the compensating voltage from the collector of transistor 28 would be supplied to the emitter (rather than the base) of transistor 10 where an effect opposite to that desired would be produced.

By providing positive signal feedback in the above manner, the input impedance of the amplifying circuit including transistor 10 will be almost triple that of the same circuit without the feedback. In a typical circuit the size of coupling capacitor 26 can be reduced from about 0.5 to 0.1 μf without decreasing the circuits performance. As will be recognized by those skilled in the art, such a reduction in the size of a coupling capacitor, particularly when used in association with an integrated circuit, is highly desirable. Since the positive feedback circuit also provides collector current temperature compensation, the amplifying circuit of the invention can be operated throughout a wide range of ambient temperatures without driving the base bias of transistor 20 to a nonlinear operating point.

FIG. 2—INTEGRATED CIRCUIT LAYOUT

The circuit of FIG. 1 shown in solid lines (heavy and light) can be formed as part of a monolithic integrated circuit according to well known integrated circuit techniques. Although not limited thereto, the present circuit is well adapted to fabrication in integrated circuit form since, as stated, it does not require a capacitor (which is difficult to provide in integrated circuits) to produce positive signal feedback. Also, in an integrated circuit transistors 10 and 28 will be very close together and part of the same chip so that excellent temperature compensation will be achieved.

FIG. 2 shows one layout of the circuit of FIG. 1 (excluding the separated input and output circuits) formed as part of a monolithic silicon chip. The integrated circuit of FIG. 2 is formed by growing an N-type epitaxial layer upon a P-type substrate, forming an oxide over the epitaxial layer, and the diffusing the "8" shaped P-type region 50 down to the substrate through a cut in the oxide to isolate two N-type regions for transistors 10 and 28. Thereafter resistors 12, 16, 18, 34, 30, and 32 as well as the bases of both transistors are formed by means of a P-type diffusion through cuts in the oxide layer, and subsequently the emitters of both transistors are formed by means of a high-concentration N-type diffusion through cuts in the oxide layer. Thereafter additional cuts are made through the oxide layer to provide access to the underlying silicon at the ends of each resistor as well as the base, emitter, and collector regions of each transistor and metallic interconnections (e.g., of aluminum) are evaporated over the monolith in the pattern illustrated; these interconnections will contact the underlying silicon where the cuts were made. Optionally a pair of high-concentration N-type deposits may be formed on the P-type substrate before the growth of the epitaxial layer where the collectors are to be subsequently formed so as to provide a low resistance layer under each collector to reduce collector resistance.

While there has been described what is at present considered to be the preferred embodiment of the invention it will be apparent that various modifications and other embodiments thereof will occur to those skilled in the art within the scope of the invention. Accordingly, it is desired that the scope of the invention be limited by the appended claims only.

I claim:

1. An amplifying circuit comprising a first transistor, a first resistor having one terminal connected to the emitter of said transistor, a bias source connected between the other terminal of said first resistor and the collector circuit of said first transistor, means for supplying an input signal between the base of said first transistor and said other terminal of said first resistor, means for supplying positive signal feedback from the emitter of said first transistor to the base thereof, said means comprising a second transistor, the emitter of which is connected to the emitter of said first transistor, the collector of which is connected (1) to a source of bias potential, and (2) to the base of said first transistor by a second resistor, and (3) to the base of said second transistor via a third resistor having a resistance value substantially equal to that of said second resistor.

2. The amplifying circuit of claim 1 further including a load impedance in the collector circuit of said first transistor and means for obtaining an output signal at said collector of said first transistor.

3. The amplifying circuit of claim 1 wherein the collectors of said first and second transistors are connected to one terminal of said bias source via respective resistors.

4. The amplifying circuit of claim 3 wherein said transistors and resistors are all formed within a monocrystalline silicon monolith having metallic surface interconnections, whereby said first and second transistors will be maintained at the same temperature so that the collector current of said first transistor will not vary as a function of temperature.

5. The amplifying circuit of claim 1 wherein said first and second transistors have like conductivity types, the emitters thereof being directly connected together, the collectors thereof being connected to one terminal of said bias source via respective resistors.

6. The amplifying circuit of claim 1 further including a subsequent transistor amplifying circuit responsive to the output of said first-named amplifying circuit, the base of the transistor of said subsequent circuit being direct-current coupled to the collector of said first transistor.

References Cited

UNITED STATES PATENTS

| | | | |
|---|---|---|---|
| 3,205,458 | 9/1965 | Geery | 330—23 X |
| 3,230,468 | 1/1966 | Pearlman | 330—23 |
| 3,271,685 | 9/1966 | Husher et al. | 330—38 X |
| 3,364,434 | 1/1968 | Widlar | 330—16 |

ROY LAKE, *Primary Examiner.*

L. J. DAHL, *Assistant Examiner.*

U.S. Cl. X.R.

330—26, 38